United States Patent
Chen et al.

(10) Patent No.: US 9,330,961 B2
(45) Date of Patent: May 3, 2016

(54) STACKED PROTECTION DEVICES AND RELATED FABRICATION METHODS

(71) Applicants: Weize Chen, Phoenix, AZ (US); Patrice M. Parris, Phoenix, AZ (US)

(72) Inventors: Weize Chen, Phoenix, AZ (US); Patrice M. Parris, Phoenix, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 172 days.

(21) Appl. No.: 14/034,213

(22) Filed: Sep. 23, 2013

(65) Prior Publication Data

US 2015/0085407 A1  Mar. 26, 2015

(51) Int. Cl.
*H01L 21/768* (2006.01)
*H01L 27/02* (2006.01)

(52) U.S. Cl.
CPC .......... *H01L 21/768* (2013.01); *H01L 27/0248* (2013.01); *H01L 27/0255* (2013.01); *H01L 27/0259* (2013.01)

(58) Field of Classification Search
CPC ............ H01L 27/0248; H01L 27/0255; H01L 27/0259; H01L 21/768
USPC ......................................................... 361/56
See application file for complete search history.

(56) References Cited

U.S. PATENT DOCUMENTS

| | | | | |
|---|---|---|---|---|
| 4,268,846 | A | * | 5/1981 | Spellman et al. ............. 257/162 |
| 5,212,618 | A | * | 5/1993 | O'Neill et al. ................ 361/56 |
| 5,825,600 | A | | 10/1998 | Watt |
| 6,157,530 | A | | 12/2000 | Pequignot et al. |
| 6,600,356 | B1 | * | 7/2003 | Weiss .................. H01L 27/0259 327/310 |
| 7,911,750 | B2 | | 3/2011 | Zhan et al. |
| 8,242,566 | B2 | | 8/2012 | Zhan et al. |
| 8,279,566 | B2 | | 10/2012 | Whitefield et al. |
| 8,432,654 | B2 | | 4/2013 | Whitefield et al. |
| 2013/0075854 | A1 | * | 3/2013 | Chang ................. H01L 27/0259 257/477 |

OTHER PUBLICATIONS

Chen, W., U.S. Appl. No. 14/644,041 entitled "Stacked Protection Devices With Overshoot Protection and Related Fabrication Methods," filed Mar. 10, 2015.
Parris, Patrice M., U.S. Appl. No. 14/567,291 entitled, "Semiconductor Device and Related Protection Methods," filed Dec. 11, 2014.
Sarbishaei, H. et al., "A New Flip-Flop-Based Transient Power Supply Clamp for ESD Protection," IEEE Transactions on Device and Materials Reliability, vol. 8, No. 2, Jun. 2008.

* cited by examiner

Primary Examiner — Scott Bauer

(57) ABSTRACT

Protection device structures and related fabrication methods and devices are provided. An exemplary device includes a first interface, a second interface, a first protection circuitry arrangement coupled to the first interface, and a second protection circuitry arrangement coupled between the first protection circuitry arrangement and the second interface. The second protection circuitry arrangement includes a first transistor and a diode coupled to the first transistor, wherein the first transistor and the diode are configured electrically in series between the first protection circuitry arrangement and the second interface.

17 Claims, 8 Drawing Sheets

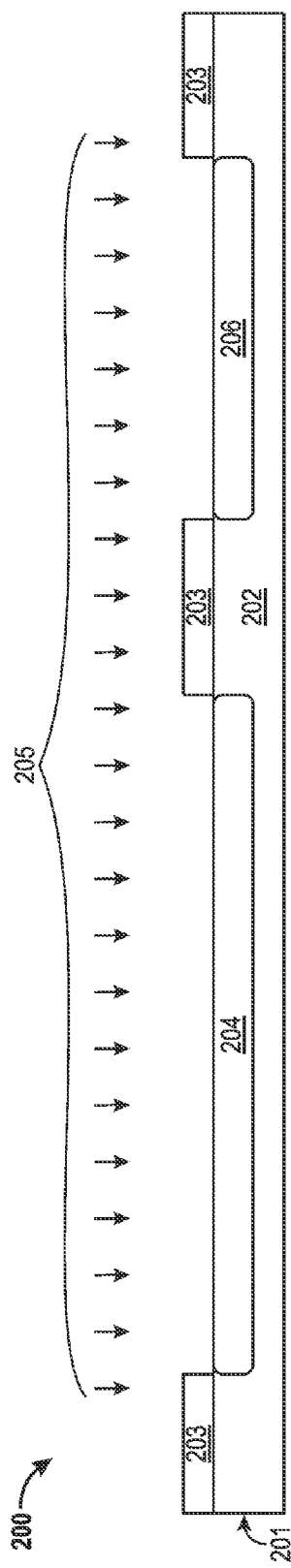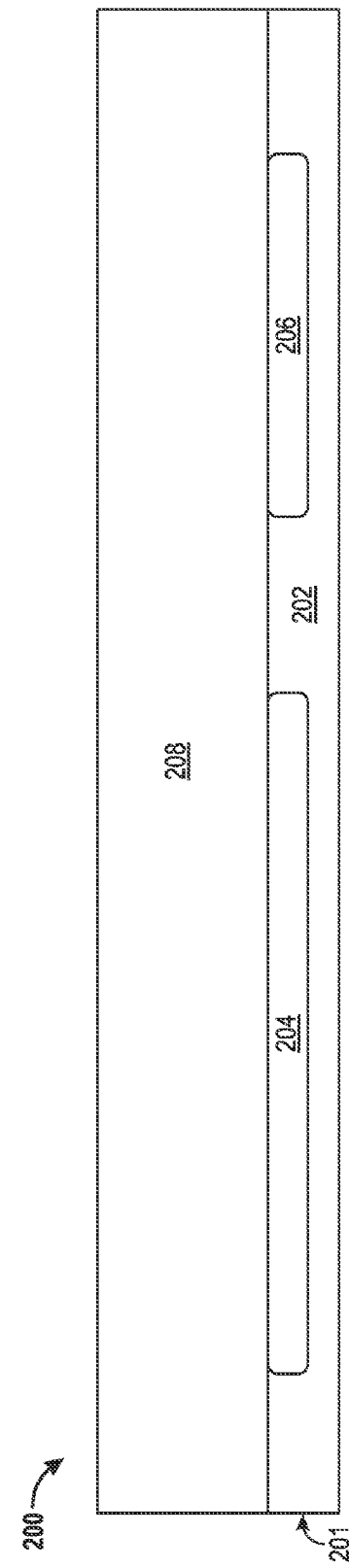

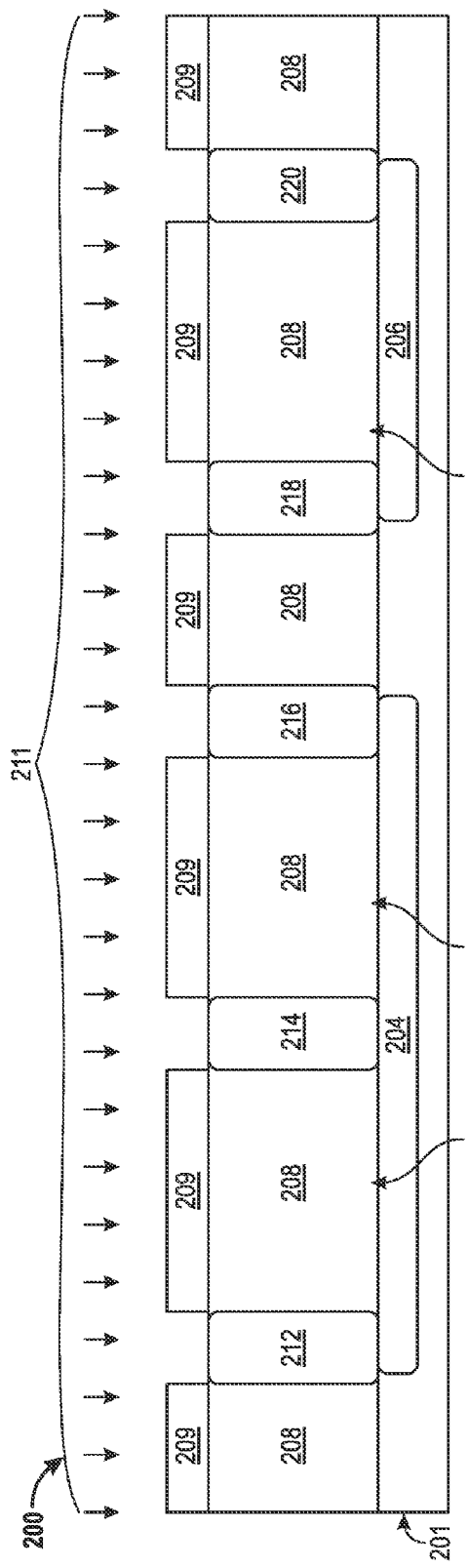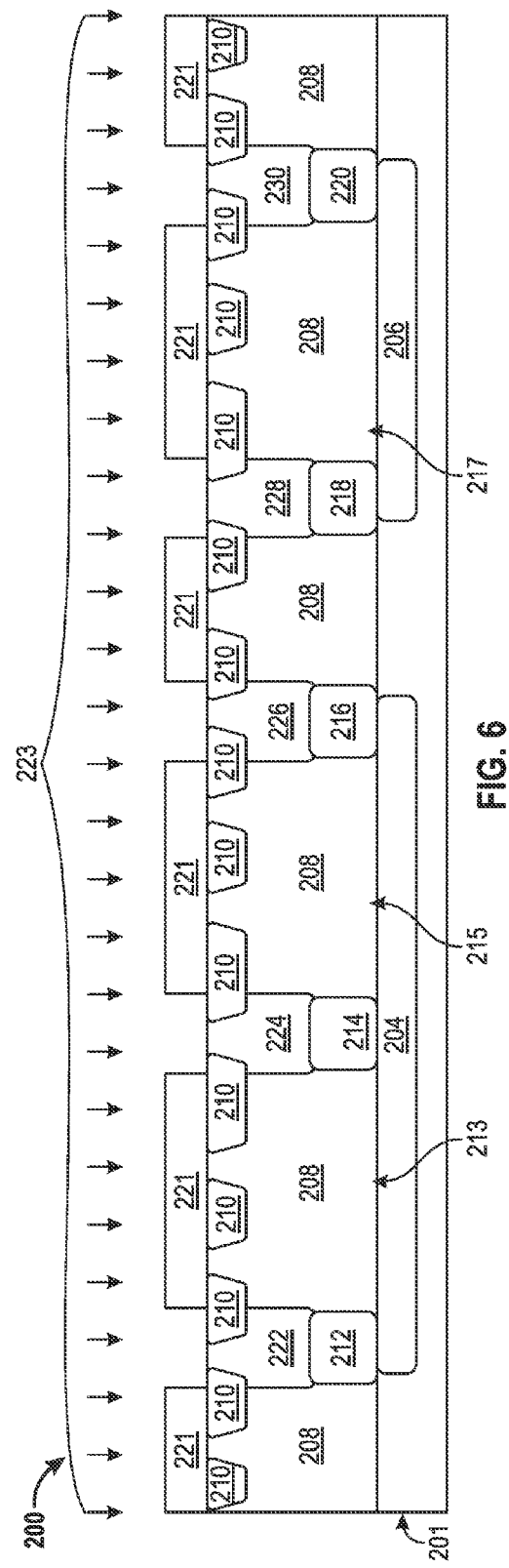

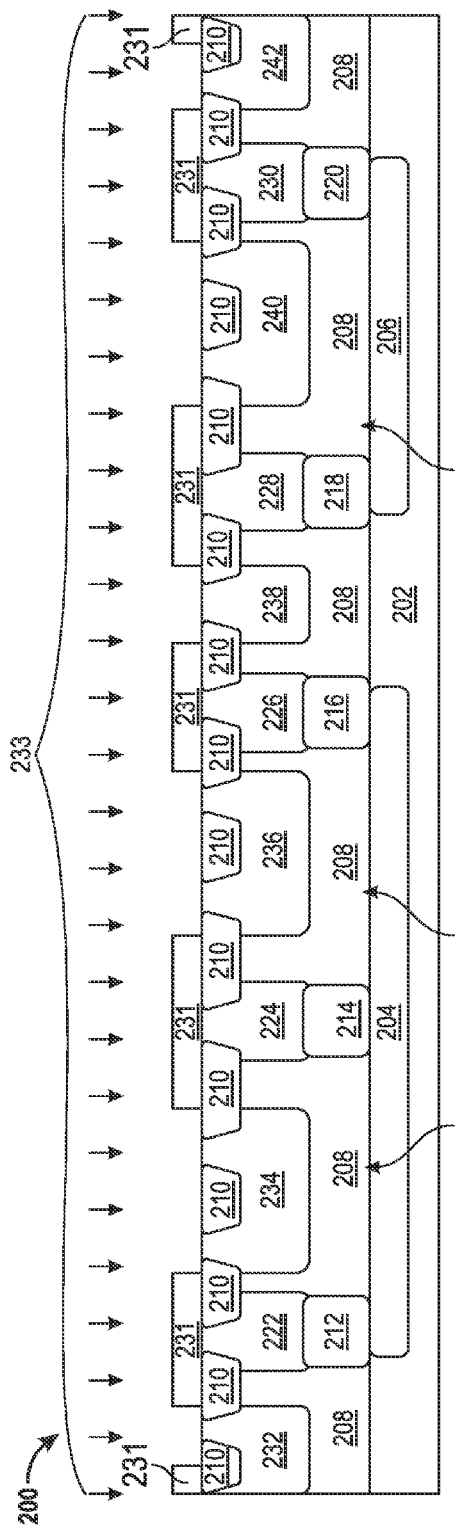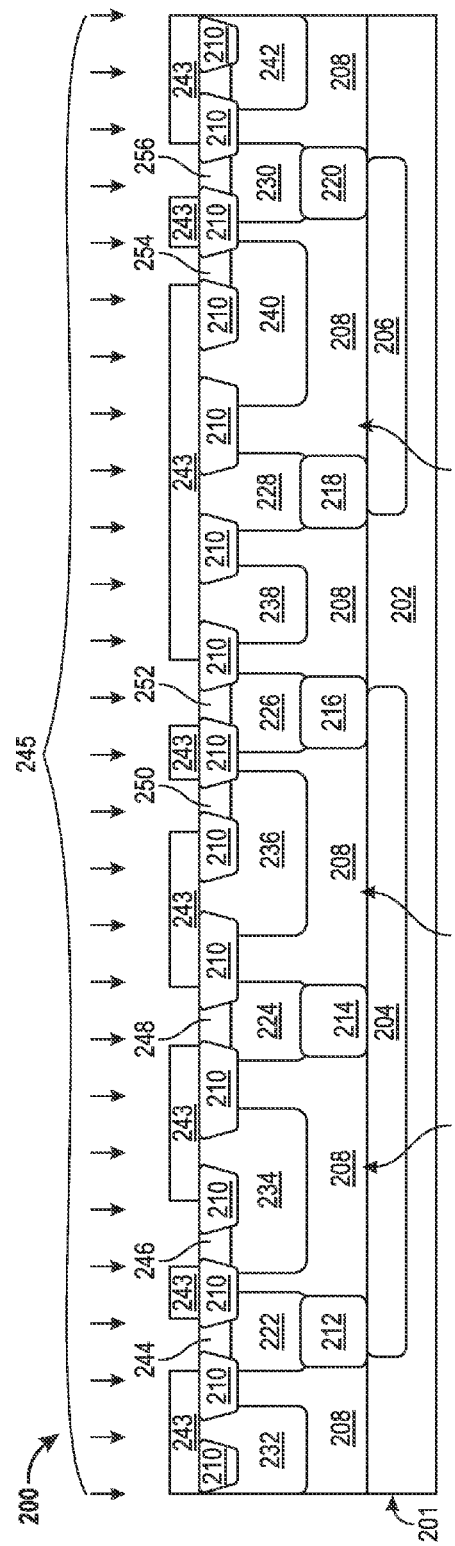

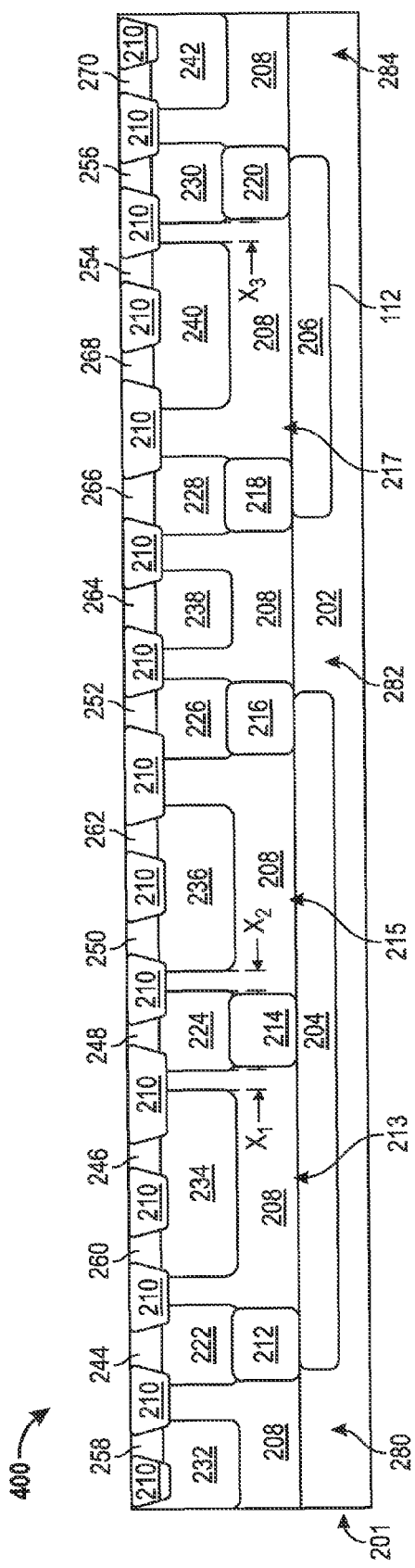
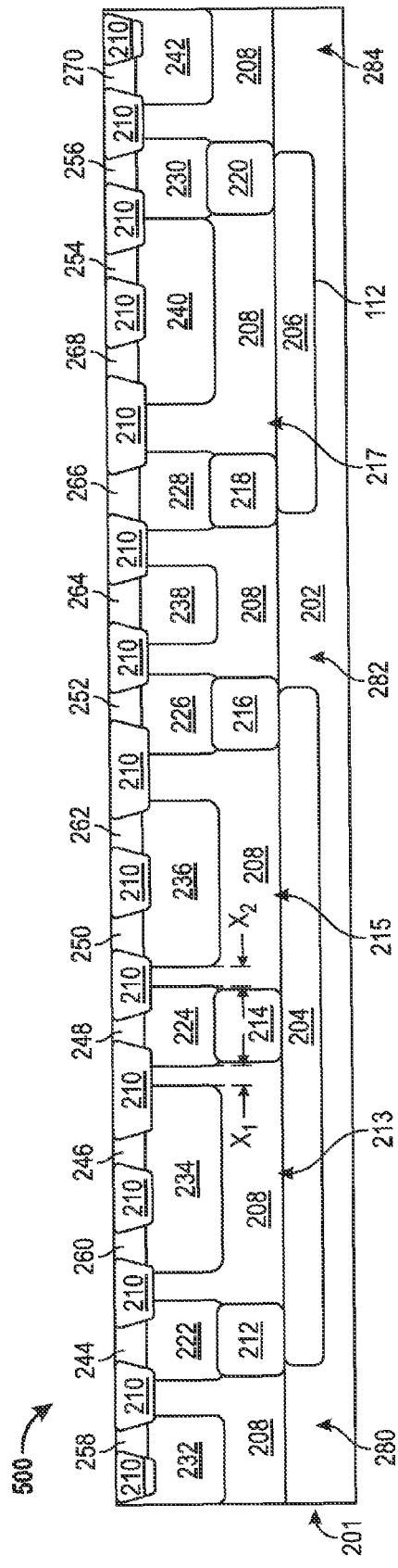
FIG. 11
FIG. 12

STACKED PROTECTION DEVICES AND RELATED FABRICATION METHODS

TECHNICAL FIELD

Embodiments of the subject matter described herein relate generally to electronic devices, and more particularly, to electrostatic discharge protection devices and related fabrication methods.

BACKGROUND

Modern electronic devices, and particularly, integrated circuits, are at risk of damage due to electrostatic discharge (ESD) events. During an ESD event, a voltage (or current) may be provided to one or more terminals of an electronic device that causes the voltage between those terminals to exceed the designed maximum voltage of the device, which could impair subsequent operation of the device. For example, a voltage at a terminal of an electronic device during an ESD event may exceed the breakdown voltage of one or more components of the device, and thereby potentially damage those components. Accordingly, electronic devices include discharge protection circuitry that provides protection from excessive voltages across electrical components during ESD events.

To avoid interfering with normal operation of the device being protected, the discharge protection circuitry is typically designed to turn on and conduct current when the applied voltage exceeds the operating voltage of the device but before the applied voltage exceeds the breakdown voltage of the device. In practice, the discharge protection circuitry may continue to conduct current after being triggered by a transient voltage until the applied voltage is decreased below a particular voltage, referred to as a holding (or snapback) voltage. When the holding voltage is less than the design voltage, discharge protection circuitry may be susceptible to latchup and continue to conduct current at the design voltage, thereby impairing the functionality of the discharge protection circuitry after an ESD event. For example, a transient noise superimposed on a supply voltage may cause the discharge protection circuitry to turn on and continue conducting current after the transient noise is removed.

Multiple instances of protection circuitry may be used to increase the triggering voltage and/or the holding voltage, for example, by "stacking" or otherwise configuring the instances of protection circuitry so that the total triggering and/or holding voltage corresponds to a sum of the triggering and/or holding voltages of the individual instances of protection circuitry. However, using multiple instances of protection circuitry undesirably consumes die area that could otherwise be allocated to other circuitry. Accordingly, it is desirable to improve the area efficiency of the protection circuitry.

BRIEF DESCRIPTION OF THE DRAWINGS

The various embodiments will hereinafter be described in conjunction with the following drawing figures, which are not necessarily drawn to scale, wherein like numerals denote like elements, and wherein:

FIGS. 3-9 illustrate, in cross section, exemplary methods for fabricating the semiconductor device structure of FIG. 2 in accordance with one embodiment of the invention;

FIG. 11 depicts a cross-sectional view of another exemplary semiconductor device structure suitable for use as the stacked protection arrangement in the electronic device of FIG. 1 in accordance with one or more embodiments of the invention;

FIG. 12 depicts a cross-sectional view of another exemplary semiconductor device structure suitable for use as the stacked protection arrangement in the electronic device of FIG. 1 in accordance with one or more embodiments of the invention.

DETAILED DESCRIPTION

Figure 1:
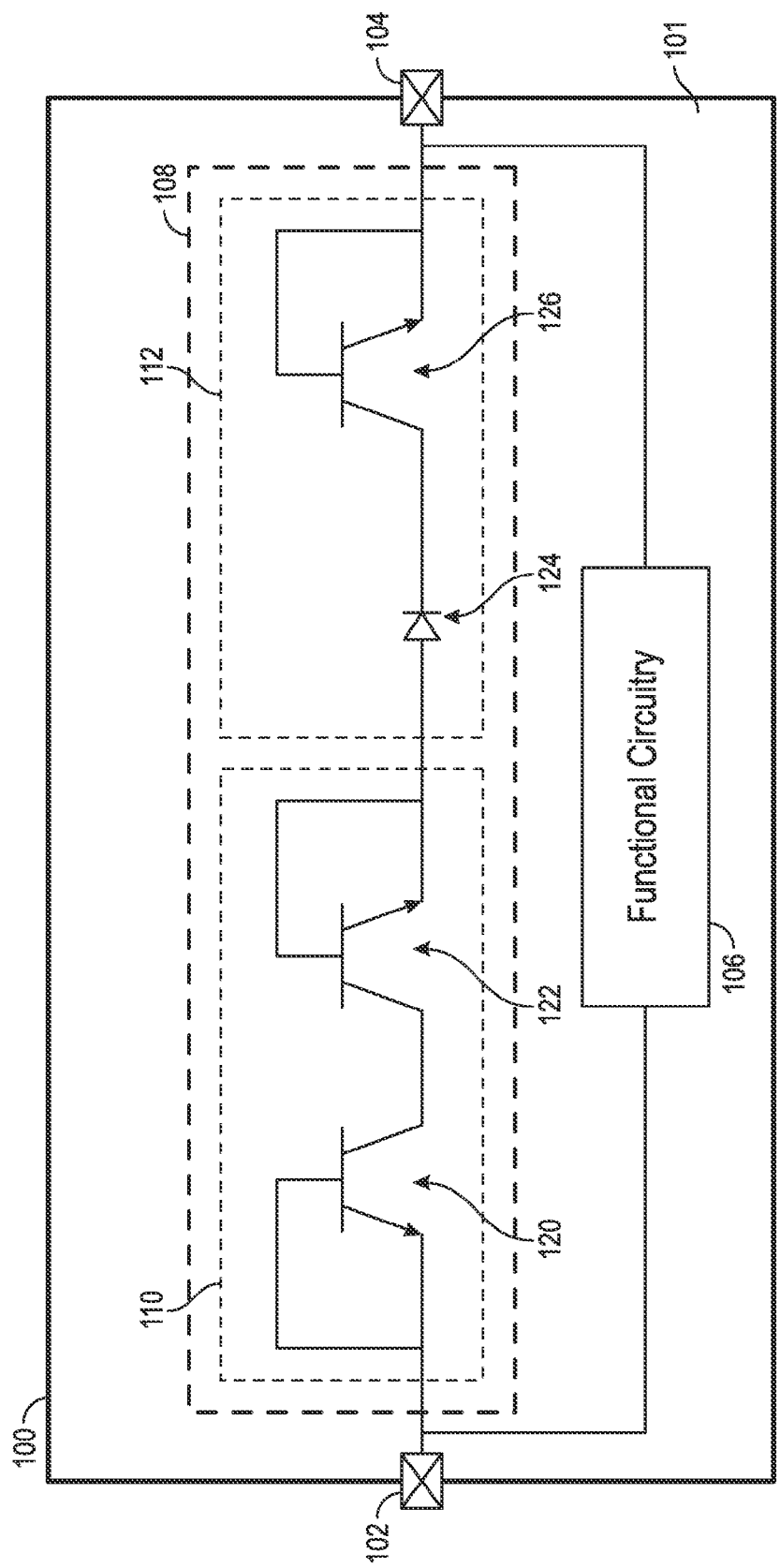
FIG. 1 is a schematic diagram of an exemplary electronic device in accordance with one embodiment of the invention.

The following detailed description is merely illustrative in nature and is not intended to limit the embodiments of the subject matter or the application and uses of such embodiments. Any implementation described herein as exemplary is not necessarily to be construed as preferred or advantageous over other implementations. Additionally, there is no intention to be bound by any expressed or implied theory presented in the preceding technical field, background, or the following detailed description.

Embodiments of the subject matter described herein relate to electronic devices that include multiple instances of electrostatic discharge (ESD) protection circuitry that are stacked, cascoded, or otherwise configured electrically in series with one another to provide a higher level of ESD protection for a particular electronic device. As described in greater detail below, the stacked instances of protection circuitry are not identical to one another, that is, the configuration of one instance of protection circuitry is different from another instance of protection circuitry. In exemplary embodiments, a first instance of protection circuitry includes a pair of bipolar junction transistor (BJT) elements configured to provide bidirectional ESD protection (e.g., by conducting discharge current in either direction), while a second instance of protection circuitry includes a single BJT element configured electrically in series with a diode element. In this regard, the second instance of protection circuitry functions similarly to the first instance of protection circuitry when providing ESD protection in one direction (e.g., the forward direction), but the die area consumed by the second instance of protection circuitry is reduced relative to the first instance of protection circuitry. For purposes of explanation, the instance of protection circuitry including the diode element may alternatively be referred to herein as being unidirectional in that it contributes to increasing the level of ESD protection (e.g., increased triggering voltage, breakdown voltage, and/or holding voltage) primarily in only one direction when stacked with other instances of protection circuitry in a stacked protection arrangement. Thus, when the unidirectional protection circuitry and the bidirectional protection circuitry are stacked, the level of ESD protection achievable by the stacked protection arrangement in the forward direction may be substantially equal to the level of ESD protection achievable by stacking two instances of the bidirectional protection circuitry while providing bidirectional ESD protection and potentially requiring less die area than stacking two instances of the bidirectional protection circuitry.

As described in greater detail below in the context of FIGS. 2-9, in exemplary embodiments, the diode element is realized as a vertical P-N diode having a cathode that is adjacent to the base of the BJT element of the unidirectional protection circuitry and electrically connected to the collector of the BJT element of the unidirectional protection circuitry. The diode element and the BJT element are electrically in series, such that current flowing through the diode element in the forward direction flows through the collector of the BJT element in series. In exemplary embodiments, the base and emitter of the BJT element are electrically connected to one another and coupled to an interface of the electronic device that is configured to receive a ground reference voltage, a negative reference voltage, or another relatively low reference voltage for the electronic device. The bidirectional protection circuitry includes a first BJT element having a respective base and emitter that are electrically connected to one another and coupled to another interface of the electronic device that is configured to receive a supply reference voltage, a positive reference voltage, or another relatively high reference voltage for the electronic device. The collector of the first BJT element is electrically connected to the collector of the second BJT element of the bidirectional protection circuitry, such that the BJT elements are electrically in series and current flowing through the first BJT element in the forward direction flows through the collector of the second BJT element in series. The base and emitter of the second BJT element are electrically connected to one another, and also, electrically connected to the anode of the diode element. In this manner, the BJT elements and the diode element are configured electrically in series between the device interfaces, such that a discharge current in the forward direction from the higher voltage device interface to the lower voltage device interface flows in series through the BJT elements of the bidirectional protection circuitry, the diode element of the unidirectional protection circuitry, and the BJT element of the unidirectional protection circuitry. As described in greater detail below, by virtue of the series configuration, the breakdown voltage of the BJT element of the unidirectional protection circuitry is effectively added to the breakdown voltage of the second BJT element of the bidirectional protection circuitry to increase the level of ESD protection in the forward direction. In the reverse direction, the first BJT element of the bidirectional protection circuitry conducts the discharge current via a substrate shunt while the diode element and the BJT element of the unidirectional protection circuitry do not conduct the discharge current in the reverse direction.

Turning now to FIG. 1, an exemplary electronic device package 100 includes one or more package interfaces 102, 104, functional circuitry 106 coupled to the package interfaces 102, 104, and stacked protection arrangement 108 coupled to the interfaces 102, 104. In exemplary embodiments, the functional circuitry 106 and the stacked protection arrangement 108 are formed, fabricated, mounted, or otherwise provided on a substrate (or die) 101 and encapsulated in a common device package to achieve the packaged electronic device 100. In this regard, in some embodiments, the substrate 101 may be realized as a semiconductor substrate having both the functional circuitry 106 and the stacked protection arrangement 108 fabricated thereon, while in other embodiments, the substrate 101 may be realized as a package substrate (e.g., a lead frame, circuit board, or the like) that the functional circuitry 106 and the stacked protection arrangement 108 are soldered, affixed, or otherwise mounted to. It should be understood that FIG. 1 is a simplified representation of the electronic device 100 for purposes of explanation and ease of description, and FIG. 1 is not intended to limit the application or scope of the subject matter in any way. Thus, although FIG. 1 depicts direct electrical connections between components, alternative embodiments may employ intervening circuit elements and/or components while functioning in a substantially similar manner.

The package interfaces 102, 104 generally represent the physical input/output interfaces to/from the functional circuitry 106 encapsulated in the electronic device 100. Depending on the embodiment, each of the package interfaces 102, 104 may be realized as an individual pin, pad, lead, terminal, solder ball, or another suitable physical interface to the electronic device 100. In accordance with one or more embodiments, the design (or intended) voltage for the first package interface 102 is greater than the design voltage for the second package interface 104. For example, the first package interface 102 may be realized as a positive reference (or supply) voltage input to the electronic device 100 and the second package interface 104 is realized as a negative reference (or ground) voltage input to the electronic device 100. For purposes of explanation, but without limitation, the first package interface 102 may alternatively be referred to herein as the higher voltage terminal, the positive reference voltage terminal, the supply voltage terminal, or the like, while the second package interface 104 may alternatively be referred to herein as the lower voltage terminal, the negative reference voltage terminal, the ground voltage terminal, or the like.

The functional circuitry 106 generally represents the components of the electronic device 100 configured to provide the desired functionality for the electronic device 100. In this regard, depending on the embodiment, the functional circuitry 106 may be realized as any suitable combination of processing circuitry (e.g., one or more processing cores, processors, controllers, microcontrollers, microprocessors, or the like), logic circuitry, memories or other data storage elements, discrete components, analog and/or digital components, or other hardware components and/or circuitry configured to provide the desired functionality for the electronic device 100. In an exemplary embodiment, the functional circuitry 106 is coupled to the package interfaces 102, 104 to receive a supply voltage, design voltage, or another operating voltage that facilitates the desired operation of the functional circuitry 106.

Still referring to FIG. 1, the stacked protection arrangement 108 is electrically connected between the higher voltage terminal 102 and the lower voltage terminal 104 and configured electrically parallel to the functional circuitry 106 to protect the functional circuitry 106 from a transient voltage difference between the device terminals 102, 104 that exceeds a breakdown voltage ($V_B$) of the functional circuitry 106. The stacked protection arrangement 108 functions as an ESD voltage clamp that begins conducting a discharge current in a forward direction when a transient voltage at the higher voltage terminal 102 relative to the voltage at the lower voltage terminal 104 exceeds a transient triggering voltage ($V_{TT}$) of the stacked protection arrangement 108, or alternatively, when a steady state (or DC) voltage at the higher voltage terminal 102 relative to the voltage at the lower voltage terminal 104 exceeds a steady state (or DC) breakdown voltage ($V_{TDC}$) of the stacked protection arrangement 108. In this regard, both the steady state (or DC) breakdown voltage ($V_{TDC}$) and transient triggering voltage ($V_{TT}$) of the stacked protection arrangement 108 are chosen to be greater than the supply (or operating) voltage ($V_O$) of the functional circuitry 106 but less than the breakdown voltage ($V_B$) of the functional circuitry 106. In this manner, the stacked protection arrangement 108 conducts current when the voltage difference between the terminals 102, 104 exceeds a ESD triggering voltage (i.e., the DC breakdown voltage ($V_{TDC}$) or the transient triggering voltage ($V_{TT}$)) and thereby clamps the voltage difference that the functional circuitry 106 is exposed to. Thus, the likelihood of the functional circuitry 106 being exposed to a voltage difference that exceeds the breakdown voltage ($V_B$) of the functional circuitry 106 during an ESD event is reduced. As described in greater detail below in the context of FIG. 3, in exemplary embodiments, the stacked protection arrangement 108 also functions as an ESD voltage clamp when the transient voltage at the lower voltage terminal 104 relative to the voltage at the higher voltage terminal 102 exceeds a reverse triggering/breakdown voltage of the stacked protection arrangement 108. In this regard, the stacked protection arrangement 108 may be understood as providing bidirectional ESD protection.

Figure 2:
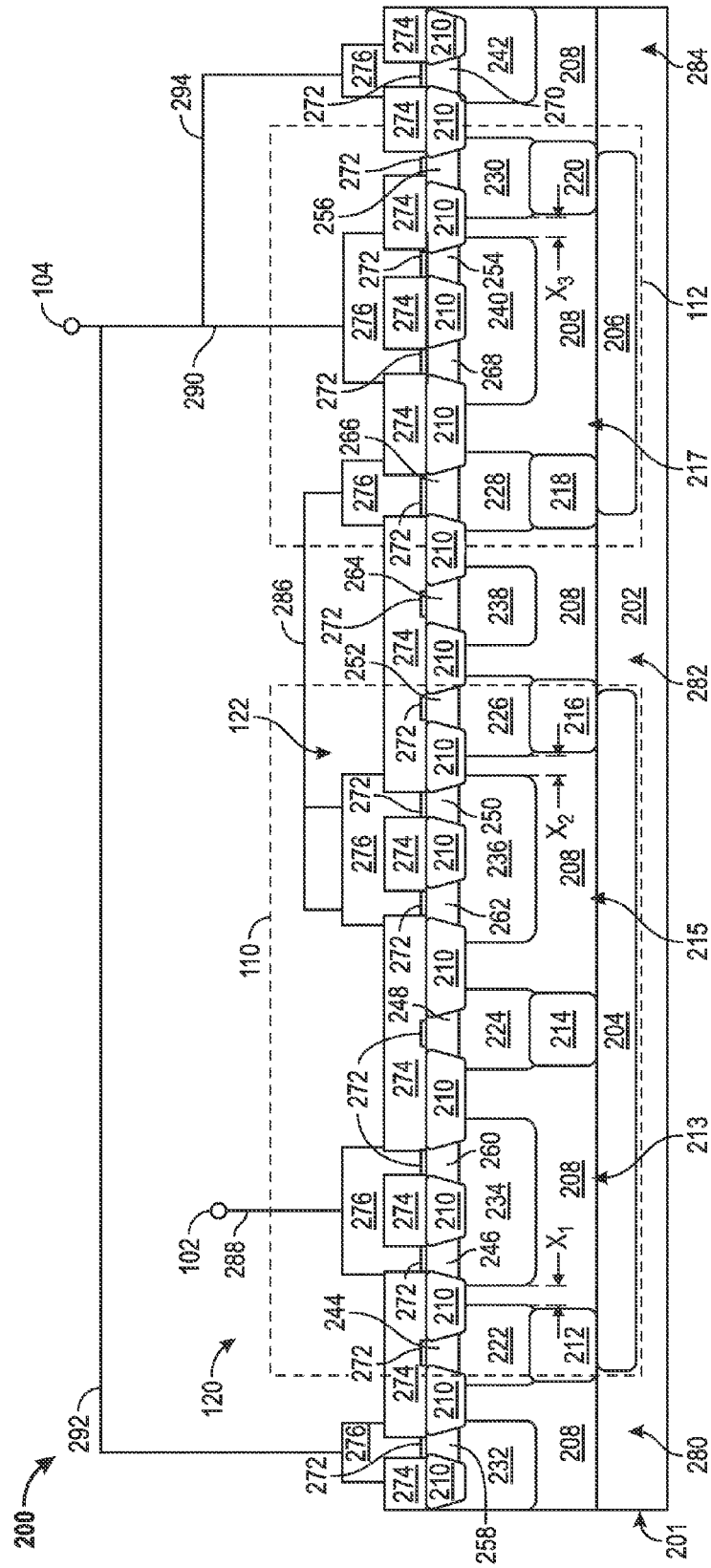
FIG. 2 depicts a cross-sectional view of one exemplary semiconductor device structure suitable for use as the stacked protection arrangement in the electronic device of FIG. 1 in accordance with one or more embodiments of the invention.

In exemplary embodiments, the stacked protection arrangement 108 includes a first protection circuitry arrangement 110 coupled to the higher voltage terminal 102 and a second protection circuitry arrangement 112 coupled between the first protection circuitry arrangement 110 and the lower voltage terminal 104. The first protection circuitry arrangement 110 and the second protection circuitry arrangement 112 are stacked or cascoded and connected in series between the terminals 102, 104 to achieve the desired triggering voltage and/or holding voltage required by the particular functional circuitry 106 of interest. The stacked protection circuitry arrangements 110, 112 may be formed or otherwise provided on the substrate 101 adjacent to or otherwise proximate one another as illustrated in FIG. 2. It should be noted that although not illustrated in FIG. 1, in practice, additional protection circuitry arrangements may be provided in series with the stacked protection circuitry arrangements 110, 112 to further increase the triggering voltage and/or holding voltage of the stacked protection arrangement 108. Accordingly, the subject matter described herein is not limited to any particular number of protection circuitry arrangements that are included in the stacked protection arrangement 108.

Still referring to FIG. 1, in exemplary embodiments, the first protection circuitry arrangement 110 is bidirectional and capable of conducting discharge current in either direction relative to the higher voltage terminal 102. The illustrated first protection circuitry arrangement 110 includes a pair of bipolar junction transistor (BJT) elements 120, 122 configured to provide an ESD voltage clamp. As illustrated, a first NPN BJT element 120 has an emitter electrode coupled to the higher voltage terminal 102, a base electrode electrically connected directly to the emitter electrode (e.g., short-circuited or via a negligible series impedance) and coupled to the higher voltage terminal 102, and a collector electrode coupled to the collector electrode of the second NPN BJT element 122. The emitter electrode and the base electrode of the second BJT element 122 are electrically connected (or short-circuited) and coupled to the lower voltage terminal 104 via the second protection circuitry arrangement 112. In one or more exemplary embodiments, the collector electrodes of the BJT elements 120, 122 include or are otherwise coupled to a common doped region, that is, the BJT elements 120, 122 may share a common collector electrode region formed in a semiconductor substrate. It should be noted that while the subject matter may be described herein in the context of NPN bipolar junction transistor elements, the subject matter is not intended to be limited to NPN bipolar junction transistor elements and may be implemented in an equivalent manner for PNP bipolar junction transistor elements. That said, the benefits of NPN bipolar junction transistor elements often make NPN bipolar junction transistor elements preferable for many applications. Accordingly, for purposes of explanation but without limitation, the subject matter is described herein in the context of NPN devices.

The second protection circuitry arrangement 112 is unidirectional and capable of conducting discharge current in a direction from the higher voltage terminal 102 toward the lower voltage terminal 104. In this regard, the second protection circuitry arrangement 112 includes a P-N diode 124 having its anode coupled to the base/emitter of the second BJT element 122 and its cathode coupled to the lower voltage terminal 104 via a third BJT element 126 of the second protection circuitry arrangement 112 such that the diode 124 is forward-biased (without conducting current) during normal operation of the electronic device 100 when a positive supply voltage relative to the lower voltage terminal 104 is applied at the higher voltage terminal 102. In exemplary embodiments, the diode 124 is realized as a vertical diode (e.g., a substantially horizontal P-N junction) to reduce the lateral area on the die 101 occupied by the diode 124. The emitter electrode and the base electrode of the third BJT element 126 are electrically connected (or short-circuited) and coupled to the lower voltage terminal 104, and the collector electrode of the third BJT element 126 is coupled to the cathode of the diode 124.

When the voltage applied to the higher voltage device terminal 102 relative to the lower voltage device terminal 104 is increased, very little current flows through the stacked protection arrangement 108 until the transient triggering voltage ($V_{TT}$) of the stacked protection arrangement 108 is reached, at which point avalanche breakdown in the BJTs 122, 126 occurs and the stacked protection arrangement 108 begins conducting an ESD discharge current from the higher voltage terminal 102 to the lower voltage terminal 104 via the diode 124 and the BJTs 120, 122, 126. In this regard, the transient triggering voltage corresponds to the sum of the avalanche breakdown voltages of the BJTs 122, 126 plus the forward bias voltages of the diode 124 and the BJT 120. Accordingly, the relationship of the transmission line pulse current in the forward direction (e.g., from the higher voltage terminal 102 to the lower voltage terminal 104) with respect to the voltage applied to the higher voltage terminal 102 resembles that of a typical stacked ESD protection arrangement, such as, for example, a stacked protection arrangement including two instances of the first protection circuitry arrangement 110 cascoded between device terminals 102, 104. However, the area of the stacked protection arrangement 108 is reduced by virtue of the diode 124 occupying less area on the die 101 (e.g., as compared to another instance of the BJT 120 between BJTs 122, 126).

FIG. 2 illustrates, in cross-section, a semiconductor device structure 200 suitable for use as the stacked protection arrangement 108 in the electronic device 100 of FIG. 1 in accordance with one or more exemplary embodiments. The protection device structure 200 includes a first protection circuitry arrangement 110 coupled to the higher voltage terminal 102 and a second protection circuitry arrangement 112 coupled to the lower voltage terminal 104. The first protection circuitry arrangement 110 includes a first BJT element 120 having a collector (comprised of N-type regions 204, 212, 222, 244) and an emitter (comprised of N-type region 246) having a first conductivity type (e.g., N-type) and a base (comprised of P-type regions 213, 234, 260) having the opposite conductivity type. The emitter and base contact regions 246, 260 are short-circuited or otherwise electrically connected to one another and coupled to the higher voltage terminal 102, such that the electrical potential of the emitter and base of the first BJT element 120 is substantially equal to the electrical potential of the higher voltage terminal 102. The second BJT element 122 of the first protection circuitry arrangement 110 has a collector (comprised of N-type regions 204, 216, 226, 252) that is electrically connected to the collector of the first BJT element 120. In the illustrated embodiment, the collectors of the BJT elements 120, 122 are integral or otherwise abut one another via the common doped region 204 formed in the semiconductor substrate 202. The BJT elements 120, 122 may also include a common vertical collector region comprised of N-type regions 214, 224, 248 that reside laterally between the respective base regions of the respective BJT elements 120, 122 to separate the respective base regions. In exemplary embodiments, the collector regions 204, 212, 214, 216, 222, 224, 226, 244, 248, 252 are floating and not directly connected to any device terminals or any other external circuitry that could ground or otherwise influence the electrical potential of the common collector. The emitter (comprised of N-type region 250) and base (comprised of P-type regions 215, 236, 262) of the second BJT element 122 are also short-circuited or otherwise electrically connected to one another and coupled to the diode 124 in the second protection circuitry arrangement 112.

In the illustrated embodiment of FIG. 2, the diode 124 of the second protection circuitry arrangement 112 is realized as a vertical P-N diode having an anode (comprised of P-type region 266) overlying its cathode (comprised of N-type regions 218, 228) such that the P-N junction is substantially parallel (or horizontal) with respect to the lateral axis of the substrate 202. However, in alternative embodiments, the diode 124 may be realized as a lateral diode. As described above in the context of FIG. 1, the anode region 266 is coupled to the base and emitter contact regions 250, 262 of the second BJT element 122, and the cathode regions 218, 228 are electrically connected to the collector (comprised of N-type regions 220, 230, 256) of the third BJT element 126. In the illustrated embodiment, the cathode regions 218, 228 are electrically connected to the collector regions 220, 230, 256 via a common N-type region 206 formed in the semiconductor substrate 202. In this regard, the cathode of the diode 124 and the collector of the third BJT element 126 may be integral. In exemplary embodiments, the cathode and collector regions 204, 218, 220, 228, 230, 256 are floating and not directly connected to any device terminals or any other external circuitry that could ground or otherwise influence their electrical potential. The emitter (comprised of N-type region 254) and base (comprised of P-type regions 217, 240, 268) of the third BJT element 126 are short-circuited or otherwise electrically connected to one another and coupled to the lower voltage terminal 104, such that the electrical potential of the emitter and base of the third BJT element 126 is substantially equal to the electrical potential of the lower voltage terminal 104.

When an applied voltage (or electrical potential) at the higher voltage terminal 102 exceeds the applied voltage (or electrical potential) at the lower voltage terminal 104, the base-collector junction of the first BJT 120 (e.g., between base well regions 213, 234 and collector well regions 212, 222) is forward-biased, thereby raising the electrical potential of the common collector regions 204, 212, 214, 216, 222, 224, 226, 244, 248, 252. During an ESD event when a higher transient voltage is applied at terminal 102 relative to terminal 104, the collector potential increases until avalanche breakdown occurs across the collector-base junction of the second BJT 122 (e.g., between base well regions 215, 236 and collector well regions 216, 226), which, in turn, raises the electrical potential of the emitter and base contact regions 250, 262 of the second BJT 122 and forward-biases the P-N junction between the P-type anode region 266 and the N-type cathode region 228 of the diode 124, thereby raising the electrical potential of the collector regions 206, 220, 230, 256 of the third BJT 126 until avalanche breakdown occurs across the collector-base junction of the third BJT 126 (e.g., between base well regions 217, 240 and collector well regions 220, 230). In this manner, by virtue of the stacked protection circuitry arrangements 110, 112 being configured electrically in series between the device terminals 102, 104, the forward triggering and/or breakdown voltage of the protection device structure 200 corresponds to the sum of the forward triggering and/or breakdown voltage of the first protection circuitry arrangement 110 and the forward triggering and/or breakdown voltage of the second protection circuitry arrangement 112. Similarly, the forward holding voltage of the protection device structure 200 corresponds to the sum of the forward holding voltage of the first protection circuitry arrangement 110 and the forward holding voltage of the second protection circuitry arrangement 112. It should be noted that the steady state (or DC) avalanche breakdown voltage of the collector-base junction of the second BJT 122 is dictated by the distance ($x_2$) between the higher conductivity base well region 236 and the collector well region 226 (or alternatively, the width of the portion of the lower conductivity epitaxial layer 208 residing between the base well region 236 and the collector well region 226) and the respective dopant concentrations of the epitaxial layer 208, the base well region 235, and the collector well region 226. Similarly, the steady state (or DC) avalanche breakdown voltage of the collector-base junction of the third BJT 126 is dictated by the distance ($x_3$) between the higher conductivity base well region 240 and the collector well region 230 (or alternatively, the width of the portion of the lower conductivity epitaxial layer 208 residing between the base well region 240 and the collector well region 230) and the respective dopant concentrations of the epitaxial layer 208, the base well region 240, and the collector well region 230.

Still referring to FIG. 2, in exemplary embodiments, the protection device structure 200 includes one or more substrate shunt regions 280, 282, 284 adjacent to a respective protection circuitry arrangement 110, 112 to provide a shunt to the substrate 202 during an ESD event when a lower transient voltage is applied at the higher voltage terminal 102 relative to the lower voltage terminal 104. In this regard, a first substrate shunt region 280 adjacent to the first BJT 120 of the first protection circuitry arrangement 110 includes a well region 232 having the same conductivity type as the underlying substrate semiconductor material 202, 208 (which is opposite the conductivity of the adjacent collector regions 212, 222, 244) and a substrate contact region 258 within the well region 232 that is electrically coupled to the lower voltage terminal 104. Similarly, a second substrate shunt region 282 adjacent to the second BJT 122 of the first protection circuitry arrangement 110 and the diode 124 of the second protection circuitry arrangement 112 includes a P-type well region 238 and a P-type substrate contact region 264, and a third substrate shunt region 284 adjacent to the third BJT 126 of the second protection circuitry arrangement 112 includes a P-type well region 242 and a P-type substrate contact region 270. In the illustrated embodiment, the P-type substrate contact region 270 of the third substrate shunt region 284 is also coupled to the lower voltage terminal 104, however, in alternative embodiments, the P-type substrate contact region 264 may also be coupled to the lower voltage terminal 104.

During an ESD event when a lower transient voltage is applied at terminal 102 relative to terminal 104, the base potential (e.g., P-type base regions 234, 260) decreases relative to the collector potential (e.g., N-type regions 204, 212, 222, 244) until avalanche breakdown occurs across the collector-base junction of the first BJT 120 and the parasitic PNP transistor formed between the surrounding P-type substrate regions 202, 208, 232, 258, the N-type collector regions 204, 212, 222, 244, and the interior P-type base regions 208, 234, 260 is biased on. In this manner, the reverse triggering and/or breakdown voltage of the protection device structure 200 corresponds to the reverse triggering and/or breakdown voltage of the first BJT 120, which is dictated by the distance ($x_1$) between the higher conductivity base well region 234 and the collector well region 222 (or alternatively, the width of the portion of the lower conductivity epitaxial layer 208 residing between the base well region 234 and the collector well region 222) and the respective dopant concentrations of the epitaxial layer 208, the base well region 234, and the collector well region 222. In this regard, the protection device structure 200 is bidirectional in that it provides protection from ESD events in both the forward direction and the reverse direction. It should be noted that the level of ESD protection in the reverse direction can be increased or decreased by increasing or decreasing the distance ($x_1$) between the higher conductivity base well region 234 and the collector well region 222.

FIGS. 3-9 illustrate, in cross-section, an exemplary fabrication process that may be performed to fabricate the protection device structure 200 of FIG. 2 suitable for use as the stacked protection arrangement 108 in the electronic device 100 of FIG. 1 in accordance with one or more exemplary embodiments. Various steps in the manufacture of semiconductor devices are well known and so, in the interest of brevity, many conventional steps will only be mentioned briefly herein or will be omitted entirely without providing the well-known process details. Furthermore, it should be appreciated that although the subject matter may be described herein in the context of NPN BJT elements, the subject matter is not intended to be limited to NPN BJT elements and may be implemented in an equivalent manner for PNP BJT elements (e.g., by interchanging the conductivities of the doped regions). Additionally, it should be understood that the protection devices and the fabrication processes described herein are not constrained by the substrate of semiconductor material utilized, and the fabrication process described herein may also be used to create protection devices on a silicon-on-insulator (SOI) semiconductor substrate. Thus, while the subject matter may be described in the context of epitaxial fabrication processes, alternative embodiments of the protection devices and the fabrication processes described herein may not involve the epitaxial fabrication processes described herein. Additionally, it should be appreciated that the fabrication process steps described herein need not be performed in the illustrated order, and that the ordering of certain fabrication process steps described herein may be interchanged and still result in substantially the same protection device structure.

Referring now to FIG. 3, in exemplary embodiments, the protection device structure 200 is fabricated on a semiconductor substrate 201 that includes a layer of semiconductor material 202. As described in greater detail below, in exemplary embodiments, the layer of semiconductor material 202 is utilized to epitaxially grow additional semiconductor material thereon, and accordingly, for convenience, but without limitation, the layer of semiconductor material 202 may alternatively be referred to herein as the seed layer. In an exemplary embodiment, the semiconductor material 202 is realized as a silicon material, wherein the term "silicon material" is used herein to encompass the relatively pure silicon materials typically used in the semiconductor industry as well as silicon admixed with other elements such as germanium, carbon, and the like. Alternatively, the semiconductor material 202 may be realized as germanium, gallium arsenide, gallium nitride, and the like, and/or one may include layers of different semiconductor materials. In exemplary embodiments, the substrate semiconductor material 202 is lightly doped. For example, the substrate semiconductor material 202 may be realized as a P-type silicon material having a P-type dopant concentration in the range of about $$1 \times 10^{15} / cm^3$$

to about $$8 \times 10^{15} / cm^3.$$

Fabrication of the protection device structure 200 continues with masking portions of the protection device structure 200 to be utilized for substrate shunt regions 280, 282, 284 and forming doped region 204, 206 of semiconductor material within the substrate semiconductor material 202 having a conductivity type that is opposite the conductivity of the substrate semiconductor material 202. The doped regions 204, 206 are formed by masking the protection device structure 200 with a masking material 203, such as a photoresist material, that is patterned to provide an implantation mask that exposes the portions of the substrate semiconductor material 202 to be used for the doped regions 204, 206. The doped regions 204, 206 are then formed by implanting N-type ions, such as antimony ions or phosphorous ions, illustrated by arrows 205, in the substrate semiconductor material 202 with a dopant concentration in the range of about $$1 \times 10^{18} / cm^3$$

to about $$1 \times 10^{19} / cm^3$$

at an energy level in the range of about 50 kiloelectron volts (keV) to about 2000 keV so that the depths of the doped regions 204, 206 (after subsequent thermal annealing or any other diffusion) are in the range of about 0.5 to about 10 microns.

Referring now to FIG. 4, after forming the doped regions 204, 206, fabrication of the protection device structure 200 continues by removing the masking material 203 and forming or otherwise providing another doped layer of semiconductor material 208 that has a desired thickness overlying the doped regions 204, 206 and a conductivity type opposite the doped regions 204, 206. For example, a P-type epitaxial layer 208 may be formed by epitaxially growing silicon material on the substrate semiconductor material 202 and in-situ doping the silicon material by adding boron ions (or other P-type ions) to the reactants used to epitaxially grow the layer 208. In one or more embodiments, the epitaxial layer 208 has a P-type dopant concentration in the range of about $$1 \times 10^{15}/cm^3$$

to about $$8 \times 10^{15}/cm^3.$$

In an exemplary embodiment, the epitaxial layer 208 is grown to a thickness in the range of about 0.5 microns to about 10 microns, which may vary depending on the needs of a particular application. It should be understood that the protection devices and the fabrication processes described herein are not constrained by the manner in which the doped regions 204, 206 and/or P-type layer 208 are formed, and the protection device structure 200 illustrated in FIG. 4 may be fabricated or otherwise achieved in a variety of alternative manners (e.g., the P-type layer 208 does not necessarily need to be realized as an epitaxial layer and does not necessarily need to be epitaxially grown and/or in-situ doped, the doped regions 204, 206 do not necessarily need to be formed by ion implantation, etc.).

Turning now to FIG. 5, after forming the epitaxial layer 208, the fabrication process continues by masking portions of the epitaxial layer 208 and forming doped sinker regions 212, 214, 216, 218, 220 of semiconductor material having the opposite conductivity type within the epitaxial layer 208. The doped sinker regions 212, 214, 216, 218, 220 are formed by masking the protection device structure 200 with a masking material 209 that is patterned to provide an implantation mask that exposes portions of the epitaxial layer 208 to be used for the sinker regions 212, 214, 216, 218, 220 while masking the remaining portions to be used for the base regions of BJTs 120, 122, 126 and substrate shunt regions 280, 282, 284. After patterning the implantation mask 209, N-type sinker regions 212, 214, 216, 218, 220 may be formed by implanting N-type ions, such as phosphorous ions or arsenic ions, illustrated by arrows 211, in the epitaxial layer 208 with a dopant concentration in the range of about $$1 \times 10^{16}/cm^3$$

to about $$1 \times 10^{19}/cm^3,$$

and more preferably within the range of about $$1 \times 10^{17}/cm^3$$

to about $$8 \times 10^{18}/cm^3,$$

at an energy level in the range of about 50 keV to about 3000 keV to provide N-type sinker regions 212, 214, 216, 218, 220 with a depth (after subsequent thermal annealing or any other diffusion) corresponding to the thickness of the epitaxial layer 208 so that the N-type sinker regions 212, 214, 216, 218, 220 extend to and abut the N-type buried regions 204, 206. In this manner, the N-type sinker regions 212, 214, 216 are electrically connected to the N-type buried region 204 to provide the common (or integral) collector electrodes for the BJTs 120, 122 and the N-type sinker regions 218, 220 are electrically connected to the N-type buried region 206 to provide the integral cathode/collector regions of the second protection circuitry arrangement 112. As illustrated, the N-type sinker regions 212, 214, 216, 218, 220 partition the P-type epitaxial layer 208 into separate P-type regions 213, 215, 217 having a respective BJT element 120, 122, 126 fabricated therein. In this regard, N-type sinker regions 212, 216 define the lateral boundaries of the first protection circuitry arrangement 110 while sinker region 214 separates the base regions 213, 215 of the adjacent BJTs 120, 122, and sinker regions 218, 220 define the lateral boundaries of the second protection circuitry arrangement 110.

The illustrated fabrication process continues by forming shallow isolation regions of dielectric material 210 (FIG. 6) that laterally isolate subsequently formed neighboring contact regions. In this regard, shallow isolation regions of a dielectric material 210, such as an oxide material, are formed in the upper portions of the substrate 201 by performing shallow trench isolation (STI). To form the shallow isolation regions, portions of the protection device structure 200 are masked with a masking material that is patterned to expose the desired portions of the substrate 201, which are then etched to a desired depth (which is less than the thickness of the epitaxial layer 208) to form trenches, which are then filled with the dielectric material 210, for example, by performing a deposition process followed by a planarization process. In accordance with one or more exemplary embodiments, the depth of the dielectric material 210 in the shallow isolation regions is in the range of about 0.05 microns to about 1 micron, and more preferably, within the range of 0.2 microns to 0.5 microns.

Referring now to FIG. 6, in exemplary embodiments, the fabrication process continues by forming N-type well regions 222, 224, 226, 228, 230 either within the N-type sinker regions 212, 214, 216, 218, 220 or otherwise extending into and/or partially overlapping the N-type sinker regions 212, 214, 216, 218, 220. The N-well regions 222, 224, 226, 228, 230 are formed by masking the protection device structure 200 with a masking material 221 that is patterned to provide an implantation mask that exposes the sinker regions 212, 214, 216, 218, 220 while the remaining masking material 221 masks interior portions of the P-type epitaxial regions 213, 215, 217 and the P-type substrate shunt regions 280, 282, 284. In the illustrated embodiment, the lateral edges of the implantation mask are offset from the boundaries of the P-type epitaxial regions 213, 215, 217 with a respective sinker region 212, 214, 216, 218, 220 so that the subsequently formed N-well regions 222, 224, 226, 228, 230 extend laterally from a respective sinker region 212, 214, 216, 218, 220. In other words, the lateral width of a respective N-well region 222, 224, 226, 228, 230 is greater than the lateral width of the respective N-type sinker region 212, 214, 216, 218, 220 that respective N-well region 222, 224, 226, 228, 230 is formed in.

In other embodiments, the boundaries of the N-well regions 222, 224, 226, 228, 230 may be vertically aligned with the N-type sinker region 212, 214, 216, 218, 220, that is, the lateral width of a respective N-well region 222, 224, 226, 228, 230 is substantially equal to the lateral width of the respective N-type sinker region 212, 214, 216, 218, 220 that respective N-well region 222, 224, 226, 228, 230 is formed in.

After forming the implantation mask 221, the N-well regions 222, 224, 226, 228, 230 are formed by implanting N-type ions, such as phosphorous ions or arsenic ions, illustrated by arrows 223, in the epitaxial layer 208 with a dopant concentration preferably within the range of about $$1 \times 10^{16}/cm^3$$

to about $$1 \times 10^{19}/cm^3,$$

and at an energy level in the range of about 50 keV to about 2000 keV to provide the N-well regions 222, 224, 226, 228, 230 with a depth (after subsequent thermal annealing or any other diffusion) that is greater than a depth of the shallow isolation regions 210 but less than a depth of the N-type sinker regions 212, 214, 216, 218, 220. In accordance with one or more exemplary embodiments, the depth of the N-well regions 222, 224, 226, 228, 230 is greater than 0.3 microns. In exemplary embodiments, the dopant concentration of the N-well regions 222, 224, 226, 228, 230 is less than or equal to the dopant concentration of the N-type sinker regions 212, 214, 216, 218, 220, however, in alternative embodiments, the dopant concentration of the N-well regions 222, 224, 226, 228, 230 may be greater than the dopant concentration of the N-type sinker regions 212, 214, 216, 218, 220. In one alternative embodiment, the N-well regions 222, 224, 226, 228, 230 and the N-type sinker regions 212, 214, 216, 218, 220 are formed concurrently as part of the same implantation process.

Turning now to FIG. 7, after forming the N-well regions 222, 224, 226, 228, 230, fabrication of the protection device structure 200 continues by masking the N-well regions 222, 224, 226, 228, 230 and forming P-type well regions 232, 234, 236, 238, 240, 242 in the interior portions of the P-type epitaxial regions 213, 215, 217 and the P-type substrate shunt regions 280, 282, 284. The P-well regions 234, 236, 240 function as a relatively higher doped portion of the base electrode of a respective BJT element 120, 122, 126 that surrounds or otherwise encompasses the emitter electrode of that respective BJT element 120, 122, 126. In this regard, the P-well regions 234, 236, 240 are formed within the respective transistor regions 213, 215, 217 proximate the N-well collector regions 222, 226, 230 so that the portion of the relatively lighter doped epitaxial region 213, 215, 217 residing between a lateral boundary of a respective N-well collector region 222, 226, 230 and the proximal lateral boundary of a respective P-well region 234, 236, 240 dictates the avalanche breakdown voltage across the collector-base junction before the resulting electrical potential of the base forward-biases the base-emitter junction and turns on or triggers a respective BJT 120, 122, 126. In other words, the distance ($x_2$) between a lateral boundary of the N-well region 226 and the proximal lateral boundary of P-well region 236 dictates the collector-to-base avalanche breakdown voltage that generates carriers and then turns on (or triggers) the BJT 122 in the forward direction, and similarly, the distance ($x_3$) between a lateral boundary of the N-well region 230 and the proximal lateral boundary of P-well region 240 dictates the collector-to-base avalanche breakdown voltage that generates carriers and then turns on (or triggers) the BJT 126 in the forward direction. Conversely, the distance ($x_1$) between a lateral boundary of the N-well region 222 and the proximal lateral boundary of P-well region 234 dictates the collector-to-base avalanche breakdown voltage that generates carriers and then turns on (or triggers) the BJT 120 in the reverse direction. In the illustrated embodiment, the P-well regions 234, 236, 240 are spaced apart from the collector well regions 222, 226, 230 by a nonzero lateral separation distance, wherein at least a portion of a respective lighter doped P-type epitaxial region 213, 215, 217 remains intact laterally between the lateral boundary of a respective P-well region 234, 236, 240 formed therein and the proximal lateral boundary of a respective collector well region 222, 226, 230. In one or more exemplary embodiments, the lateral separation distance between a lateral boundary of a respective P-well region 234, 236, 240 and the proximal lateral boundary of a respective collector well region 222, 226, 230 is less than ten microns. In some embodiments, a respective P-well region 234, 236, 240 may abut, and in some cases overlap a lateral boundary of, a respective collector well region 222, 226, 230.

To fabricate P-well regions 232, 234, 236, 238, 240, 242, the protection device structure 200 is masked with a masking material 231 that is patterned to provide an implantation mask that exposes interior portions of the P-type epitaxial regions 213, 215, 217 and the P-type substrate shunt regions 280, 282, 284 while masking the N-well regions 222, 224, 226, 228, 230. Lateral edges of the implantation mask 231 are offset from lateral boundaries of the shallow isolation regions 210 adjacent to the respective N-well regions 222, 224, 226, 228, 230 to expose portions of those shallow isolation regions 210 so that the subsequently formed P-well regions 232, 234, 236, 238, 240, 242 extend laterally beneath the shallow isolation regions 210. The P-well regions 232, 234, 236, 238, 240, 242 are then formed by implanting P-type ions, such as boron ions, illustrated by arrows 233, in the exposed portions of the epitaxial layer 208 with a dopant concentration that is greater than the dopant concentration of the P-type epitaxial layer 208, preferably within the range of $$1 \times 10^{17}/cm^3$$

to about $$1 \times 10^{19}/cm^3,$$

and more preferably about $$1 \times 10^{18}/cm^3$$

to about $$8 \times 10^{18}/cm^3,$$

and at an energy level in the range of about 50 keV to about 1500 keV to provide the P-well regions 232, 234, 236, 238, 240, 242 with a depth (after subsequent thermal annealing or any other diffusion) that is greater than a depth of the shallow isolation regions 210. In accordance with one or more exemplary embodiments, the depth of the P-well regions 232, 234, 236, 238, 240, 242 is greater than 0.3 microns. In exemplary embodiments, the depth of the P-well regions 232, 234, 236, 238, 240, 242 is less than the thickness of the epitaxial layer 208, so that at least a portion of the lighter doped P-type epitaxial layer 208 remains vertically between the P-well regions 232, 234, 236, 238, 240, 242 and the N-type buried regions 204, 206.

Figure 9:
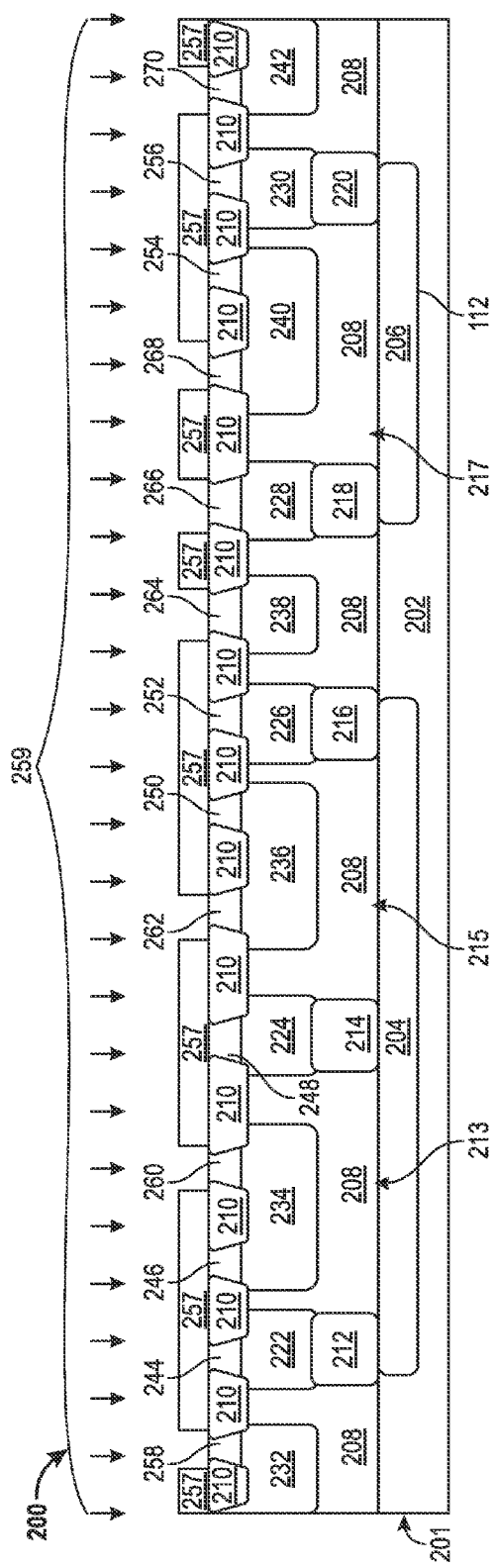

Referring now to FIGS. 8-9, after forming the P-well regions 232, 234, 236, 238, 240, 242 the fabrication process continues by appropriately masking the protection device structure 200, forming shallow N-type contact regions 244, 246, 248, 250, 252, 254, 256 within the P-type base well regions 234, 236, 240 and the N-type collector well regions 222, 224, 226, 230, and forming shallow P-type contact regions 258, 260, 262, 264, 266, 268, 270 within the P-well regions 232, 234, 236, 238, 240, 242 and the N-type cathode well region 228. In this regard, each of the N-type contact regions 246, 250, 254 functions as a relatively higher doped emitter electrode for a respective BJT 120, 122, 126, each of the N-type contact regions 244, 248, 252, 256 functions as a relatively higher doped collector electrode contact region for the collector of a respective BJT 120, 122, 126, and each of the P-type regions 260, 262, 268 functions as a relatively higher doped base electrode contact region for a respective BJT 120, 122, 126. The P-type contact region 266 formed within the N-type cathode well region 228 functions as the anode of the diode 124, while P-type contact regions 258, 264, 270 function as contacts for the substrate shunt regions 280, 282, 284.

As illustrated in FIG. 8, the shallow N-type contact regions 244, 246, 248, 250, 252, 254, 256 are formed by masking the protection device structure 200 with a masking material 243 that is patterned to expose the interior portions of the N-type collector well regions 222, 224, 226, 230 and the portions of the P-type base well regions 234, 236, 240 proximate the collector well regions 222, 224, 226, 230 between shallow isolation regions 210. The shallow N-type regions 244, 246, 248, 250, 252, 254, 256 are then formed by implanting N-type ions, such as phosphorous ions or arsenic ions, illustrated by arrows 245, in the exposed interior portions of regions 338, 342, 344 with a dopant concentration in the range of about $$1 \times 10^{19}/cm^3$$

to about $$1 \times 10^{21}/cm^3$$

and at an energy level in the range of about 20 keV to about 100 keV to provide the N-type regions 244, 246, 248, 250, 252, 254, 256 with a depth (after diffusion) that is less than a depth of the shallow isolation regions 210, and also, less than the depth of the well regions 222, 224, 226, 230, 234, 236, 240. For example, in accordance with one or more embodiments, the depth of the shallow N-type regions 244, 246, 248, 250, 252, 254, 256 is in the range of about 0.05 microns to about 0.3 microns. In the illustrated embodiment, each emitter contact region 246, 250, 254 is formed or otherwise resides within a respective higher conductivity base well region 234, 236, 240 such that the higher conductivity base well region 234, 236, 240 encompasses, surrounds and/or abuts the respective emitter contact region 246, 250, 254. It should be noted the N-type cathode well region 228 is masked by the masking material 243 prior to implanting the ions 245 for the N-type contact regions 244, 246, 248, 250, 252, 254, 256. Additionally, in some embodiments, the N-type collector well regions 222, 224, 226, 230 may also be masked prior to implanting ions 245, in which case N-type collector contact regions 244, 248, 252, 256 are absent from the protection device structure 200.

Referring to FIG. 9, in a similar manner, the shallow P-type contact regions 258, 260, 262, 264, 266, 268, 270, are formed by masking the protection device structure 200 with a masking material 257 that is patterned to expose the portions of the P-well regions 232, 234, 236, 238, 240, 242 between isolation regions 210 and the interior portion of the N-type cathode well region 238 while masking the N-type contact regions 244, 246, 248, 250, 252, 254, 256. After the masking material 257 is patterned, the shallow P-type regions 258, 260, 262, 264, 266, 268, 270 are formed by implanting P-type ions, such as boron ions, illustrated by arrows 259, in the exposed portions of the P-well regions 232, 234, 236, 238, 240, 242 and the cathode well region 228 with a dopant concentration in the range of about $$1 \times 10^{19}/cm^3$$

to about $$1 \times 10^{21}/cm^3$$

and at an energy level in the range of about 2 keV to about 50 keV to provide the P-type regions 258, 260, 262, 264, 266, 268, 270 with a depth (after diffusion) that is less than a depth of the shallow isolation regions 210 (e.g., in the range of about 0.05 microns to about 0.3 microns), and also, less than the depth of the well regions 228, 232, 234, 236, 238, 240, 242. In this regard, each of the base electrode contact regions 260, 262, 268 is encompassed or otherwise surrounded by the base well region 234, 236, 240 it is formed within.

Referring again to FIG. 2, after forming the shallow N-type and P-type contact regions, fabrication of the protection device structure 200 may be completed by forming contacts 272 on the contact regions, providing electrical connections between the respective base and emitter electrodes of the respective BJTs 120, 122, 126, providing an electrical connection 286 between the electrically connected base and emitter electrodes of the BJT 122 and the anode region 266 of the diode 124, and providing electrical connections 288, 290 to/from the electrically connected base and emitter electrodes of the respective BJTs 120, 126 and a respective physical interface 102, 104 of the electronic device 100. For example, the contacts 272 may be realized as a metal silicide layer formed by conformably depositing a layer of silicide-forming metal onto the exposed surfaces of the contact regions and heating the protection device structure 200 (e.g., by rapid thermal annealing (RTA)) to react the silicide-forming metal with the exposed silicon and form the metal silicide layer 272 at the top of the contact regions.

After the contacts 272 are formed, the fabrication process continues by forming one or more layers of dielectric material 274 overlying the protection device structure 200, removing portions of the dielectric material 274 overlying the base electrode contact regions 260, 262, 268, the emitter electrode contact regions 246, 250, 254, the anode contact region 266, and the substrate shunt contact regions 258, 264, 270 to expose their overlying contacts 272, and forming a conductive material 276 overlying the contacts 272. The dielectric material 274 may be realized as an interlayer dielectric material, such as an oxide material, that is conformably deposited overlying the protection device structure 200 in a conventional manner. Portions of the dielectric material 274 overlying the contact regions 246, 250, 254, 258, 260, 262, 264, 266, 268, 270 are removed by etching the dielectric material 274 using an anisotropic etchant to provide voided regions overlying the contacts 272, and the conductive material 276 may be formed in the voided regions by conformably depositing a metal material overlying the protection device structure 200 to a thickness that is greater than or equal to the thickness of the dielectric material 274. Although not illustrated, in practice, contact plugs may be formed in the voided regions in a conventional manner prior to forming the conductive material 276.

In exemplary embodiments, the conductive material 276 is patterned, routed, or otherwise formed to provide a direct electrical connection between the base and emitter electrode of a respective BJT 120, 122, 126, thereby effectively short-circuiting the base and emitter of the respective BJTs 120, 122, 126 together. The conductive material 276 may also be patterned, routed, or otherwise formed to provide the electrical connection 286 between the base/emitter electrode regions 250, 262 of the BJT 122 and the anode region 266 of the diode 124, the electrical connection 288 between the base/emitter electrode regions 246, 260 of the BJT 120 and the higher voltage terminal 102, and the electrical connection 290 between the base/emitter electrode regions 254, 268 of the BJT 126 and the lower voltage terminal 104. Additionally, the conductive material 276 may also be patterned, routed, or otherwise formed to provide electrical connections 292, 294 between the substrate shunt contact regions 258, 270 and the lower voltage terminal 104. In the illustrated embodiment, the dielectric material 274 overlying the collector contact regions 244, 248, 252, 256 remains intact so that the collector electrodes of the BJTs 120, 122, 126 are floating and not directly connected to any device terminals or any other external circuitry that could ground or otherwise influence their electrical potential.

Figure 10:
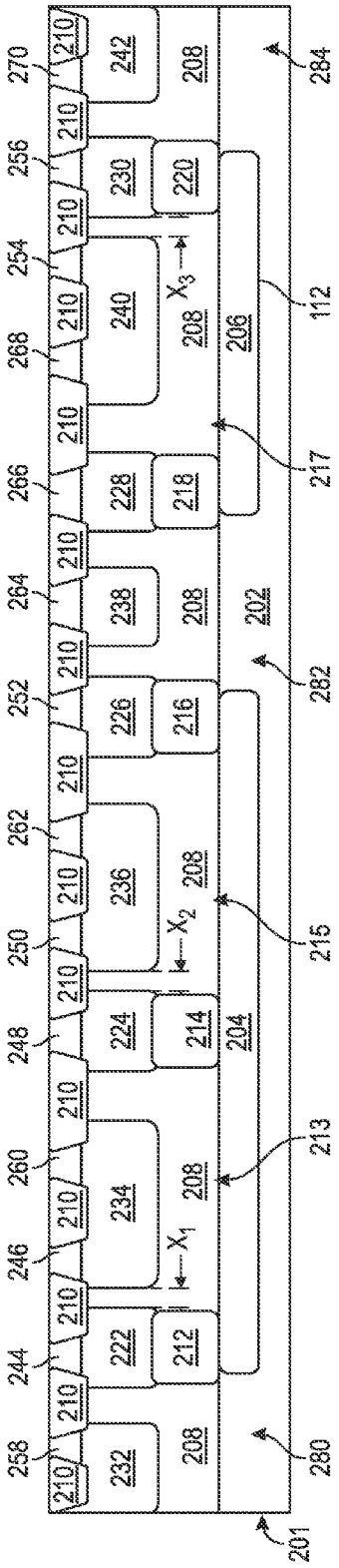
FIG. 10 depicts a cross-sectional view of another exemplary semiconductor device structure suitable for use as the stacked protection arrangement in the electronic device of FIG. 1 in accordance with one or more embodiments of the invention.

FIG. 10 depicts an alternate embodiment of a protection device structure 300 suitable for use as the stacked protection arrangement 108 in the electronic device 100 of FIG. 1. In protection device structure 300, the emitter contact region 250 of the second BJT 122 is positioned within the base well region 236 proximate the interior collector well region 224 so that avalanche breakdown occurs between the collector well region 224 and the base well region 236, while the base contact region 262 is positioned within the base well region 236 laterally between the emitter contact region 250 and the collector well region 226. In the embodiment of FIG. 10, the lateral orientation of the emitter contact region 250 and the base well region 236 with respect to the collector well region 224 is opposite the lateral orientation of the emitter contact region 254 and the base well region 240 with respect to the collector well region 230, such that variations in the lateral separation distance ($x_2$) between the collector and base well regions 224, 236 of the second BJT 122 are compensated for by corresponding variations in the lateral separation distance ($x_3$) between the collector and base well regions 230, 242 of the third BJT 126. In this regard, the protection device structure 300 compensates for alignment variations between N-well regions and P-well regions (e.g., attributable to mask and/or implant misalignment and the like) across the substrate 201 to achieve more uniform triggering, breakdown and/or holding voltages across instances of the protection device structure 300 across the substrate 201. For example, if misalignment during the fabrication process causes the N-well region 224 to be shifted relative to P-well region 236 in a direction that increases the lateral separation distance ($x_2$), the N-well region 230 may also be shifted relative to the P-well region 240 in the opposite direction to decrease the lateral separation distance ($x_3$), so that the sum of the avalanche breakdown voltage of the second BJT 122 and the avalanche breakdown voltage of the third BJT 126 is maintained substantially constant.

FIG. 11 depicts another alternate embodiment of a protection device structure 400 suitable for use as the stacked protection arrangement 108 in the electronic device 100 of FIG. 1. In protection device structure 400, the emitter contact region 246 of the first BJT 120 is positioned within the base well region 234 proximate the interior collector well region 224 so that avalanche breakdown in the reverse direction occurs between the collector well region 224 and the base well region 234, while the base contact region 260 is positioned within the base well region 234 laterally between the emitter contact region 246 and the collector well region 222.

FIG. 12 depicts another alternate embodiment of a protection device structure 500 suitable for use as the stacked protection arrangement 108 in the electronic device 100 of FIG. 1. In protection device structure 500, the lateral separation distance ($x_3$) is reduced to zero, so that the base well region 240 of the third BJT 126 abuts or is otherwise adjacent to the collector well region 230. In this regard, the forward breakdown and/or holding voltages of the third BJT 126 and/or the second protection circuitry arrangement 112 may be less than the forward breakdown and/or holding voltages of the second BJT 122 and/or the first protection circuitry arrangement 110. For example, the lateral separation distances ($x_2$, $x_3$) in the embodiment of FIG. 2 may be substantially equal to one another, so that the stacked protection arrangement 108 is symmetrical with the forward breakdown and/or holding voltages of the third BJT 126 and/or the second arrangement 112 being substantially equal to the forward breakdown and/or holding voltages of the second BJT 122 and/or the first arrangement 110. Conversely, in the embodiment of FIG. 12, the stacked protection arrangement 108 is asymmetrical with the forward breakdown and/or holding voltages of the third BJT 126 and/or the second arrangement 112 being less than the forward breakdown and/or holding voltages of the second BJT 122 and/or the first arrangement 110. Reducing the separation distance to zero (or less than zero to overlap the lateral boundaries) reduces the sensitivity of the forward breakdown voltage of the third BJT 126 to misalignment during fabrication. In alternative embodiments, the lateral separation distance ($x_2$) may also be reduced to zero, so that the base well region 236 of the second BJT 122 abuts the collector well region 224 (for the embodiment in FIG. 12) or the collector well region 236 (for the embodiment in FIG. 2). Furthermore, in some embodiments, the lateral separation distance ($x_3$) may be greater than zero while the lateral separation distance ($x_2$) is less than or equal to zero, resulting in the forward breakdown and/or holding voltages of the third BJT 126 and/or the second protection circuitry arrangement 112 being greater than the forward breakdown and/or holding voltages of the second BJT 122 and/or the first protection circuitry arrangement 110.

Figure 13:
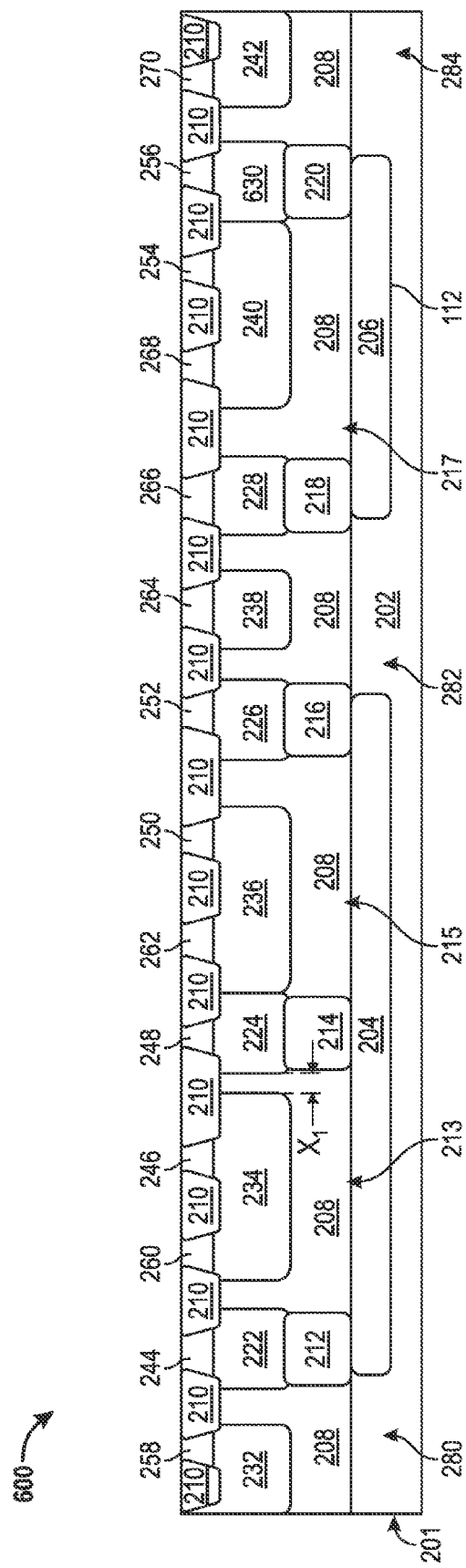
FIG. 13 depicts a cross-sectional view of another exemplary semiconductor device structure suitable for use as the stacked protection arrangement in the electronic device of FIG. 1 in accordance with one or more embodiments of the invention.

FIG. 13 depicts another alternate embodiment of a protection device structure 600 suitable for use as the stacked protection arrangement 108 in the electronic device 100 of FIG. 1. In protection device structure 600, the third BJT 126 includes a well region 630 having a dopant concentration that is different from the dopant concentration of the collector well regions 222, 224, 226. For example, the third BJT 126 may include an N-type well region 630 having a dopant concentration that is greater than or less than the dopant concentration of the collector well regions 222, 224, 226 to adjust or otherwise tune the forward breakdown voltage of the structure 600 while maintaining lateral separation distances ($x_2$, $x_3$) that are less than or equal to zero to reduce sensitivity to mask misalignment. In other words, the forward ESD protection can be tuned by varying the dopant concentrations of the well regions 222, 224, 226, 630 in lieu of varying the lateral separation distances ($x_2$, $x_3$).

For the sake of brevity, conventional techniques related to semiconductor and/or integrated circuit fabrication, ESD protection schemes, and other functional aspects of the subject matter may not be described in detail herein. In addition, certain terminology may be used herein for the purpose of reference only, and thus are not intended to be limiting. For example, the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, systems, devices, and methods configured in accordance with example embodiments of the invention relate to:

An apparatus for a device is provided in one exemplary embodiment. The device comprises a first interface, a second interface, a first protection circuitry arrangement coupled to the first interface, and a second protection circuitry arrangement coupled between the first protection circuitry arrangement and the second interface. The second protection circuitry arrangement comprises a first transistor and a diode coupled to the first transistor. The first transistor and the diode are configured electrically in series between the first protection circuitry arrangement and the second interface. In one or more embodiments, the first interface comprises a higher voltage terminal, the second interface comprises a lower voltage terminal, and functional circuitry is coupled between the higher voltage terminal and the lower voltage terminal. In one embodiment, the diode comprises a vertical P-N diode. In one or more embodiments, the first protection circuitry arrangement comprises a second transistor coupled to the first interface and a third transistor coupled electrically in series between the second transistor and the diode, wherein the diode comprises an anode coupled to an emitter of the third transistor and a cathode coupled to a collector of the first transistor. The third transistor comprises a base coupled to the anode and the first transistor comprises a second emitter coupled to the second interface and a second base coupled to the second interface. The third transistor also comprises a second collector, and the second transistor comprises a third collector coupled to the second collector, a third emitter coupled to the first interface, and a third base coupled to the first interface.

An apparatus for a semiconductor device is provided in another exemplary embodiment. The semiconductor device comprises a base region of semiconductor material having a first conductivity type, an emitter region of semiconductor material within the base region and having a second conductivity type opposite the first conductivity type, a collector region of semiconductor material having the second conductivity type, a cathode region of semiconductor material adjacent to the base region and having the second conductivity type, and an anode region of semiconductor material abutting the cathode region and having the first conductivity type. At least a portion of the base region resides between the emitter region and the collector region, and the cathode region is electrically connected to the collector region. In one embodiment, the anode region overlies the cathode region. In another embodiment, the cathode region and the collector region are abutting. In yet another embodiment, the semiconductor device further comprises a second base region of semiconductor material having the first conductivity type and a second emitter region of semiconductor material having the second conductivity type, wherein the anode region is electrically connected to the second base region and the second emitter region. The semiconductor device may further comprise a second collector region of semiconductor material having the second conductivity type, a third base region of semiconductor material having the first conductivity type, a third emitter region of semiconductor material having the second conductivity type, and a third collector region of semiconductor material having the second conductivity type. At least a portion of the second base region resides between the second emitter region and the second collector region, at least a portion of the third base region resides between the third emitter region and the third collector region, and the third collector region is electrically connected to the second collector region. In further embodiments, the semiconductor device comprises a higher voltage terminal and a lower voltage terminal, wherein the base region and the emitter region are electrically connected to the lower voltage terminal and the third base region and the third emitter region are electrically connected to the higher voltage terminal The semiconductor device may further comprise a substrate shunt region adjacent to the third collector region and having the first conductivity type, wherein the substrate shunt region is electrically connected to the lower voltage terminal.

An exemplary method of fabricating an electronic device is also provided. The method comprises forming a first protection circuitry arrangement on a substrate and forming a second protection circuitry arrangement on the substrate, wherein the second protection circuitry arrangement comprises a first transistor element and a diode element formed on the substrate and the diode element and the first transistor element are configured electrically in series. The method further comprises providing a first electrical connection between the first protection circuitry arrangement and a first device terminal, providing a second electrical connection between the second protection circuitry arrangement and a second device terminal, and providing a third electrical connection between the first protection circuitry arrangement and the second protection circuitry arrangement, wherein the third electrical connection results in the first protection circuitry arrangement and the second protection circuitry arrangement being configured electrically in series between the first device terminal and the second device terminal In one or more embodiments, forming the second protection circuitry arrangement comprises forming a base region of the first transistor element in the substrate, the base region having a first conductivity type, forming an emitter region of the first transistor element within the base region, the emitter region having a second conductivity type opposite the first conductivity type, forming a collector region of the first transistor element in the substrate, the collector region having the second conductivity type, wherein at least a portion of the base region resides between the emitter region and the collector region, forming a cathode region of the diode element in the substrate adjacent to the base region, the cathode region having the second conductivity type, and forming an anode region of the diode element in the substrate abutting the cathode region, the anode region having the first conductivity type. In one embodiment, forming the anode region comprises forming the anode region overlying the cathode region. In another embodiment, forming the first protection circuitry arrangement comprises forming a second transistor element in the substrate, the second transistor element including a second base region and a second emitter region electrically connected to the second base region, and forming a third transistor element in the substrate, the third transistor element including a third base region and a third emitter region electrically connected to the third base region, wherein a third collector region of the third transistor element is electrically connected to a second collector region of the second transistor element, wherein providing the first electrical connection comprises providing the first electrical connection between the first device terminal, the second base region, and the second emitter region, providing the second electrical connection comprises providing the second electrical connection between the second device terminal, the base region, and the emitter region, and providing the third electrical connection comprises providing the third electrical connection between the anode region, the third base region, and the third emitter region. In another embodiment, forming the base region comprises forming the base region adjacent to the collector region.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:
1. A device comprising:
a first interface;
a second interface;
a first protection circuitry arrangement coupled to the first interface; wherein the first protection circuitry arrangement comprises:
a second transistor coupled to the first interface; and
a third transistor;
a second protection circuitry arrangement coupled between the first protection circuitry arrangement and the second interface, the second protection circuitry arrangement comprising:
a first transistor; and
a diode comprising an anode connected to an emitter of the third transistor and a cathode connected to a collector of the first transistor, wherein:
the first transistor and the diode are configured electrically in series between the first protection circuitry arrangement and the second interface;
the diode is configured electronically is series between the first protection circuitry arrangement and the first transistor; and
the third transistor is coupled electrically in series between the second transistor and the diode.
2. The device of claim 1, wherein:
the first interface comprises a higher voltage terminal; and
the second interface comprises a lower voltage terminal.
3. The device of claim 2, further comprising functional circuitry coupled between the higher voltage terminal and the lower voltage terminal.
4. The device of claim 1, wherein the diode comprises a vertical P-N diode.
5. The device of claim 1, wherein:
the third transistor comprises a base coupled to the anode; and
the first transistor comprises:
a second emitter coupled to the second interface; and
a second base coupled to the second interface.
6. The device of claim 5, wherein:
the third transistor comprises a second collector; and
the second transistor comprises:
a third collector coupled to the second collector;
a third emitter coupled to the first interface; and
a third base coupled to the first interface.
7. A semiconductor device comprising:
a base region of semiconductor material having a first conductivity type;
an emitter region of semiconductor material within the base region, the emitter region having a second conductivity type opposite the first conductivity type;
a collector region of semiconductor material having the second conductivity type, wherein at least a portion of the base region resides between the emitter region and the collector region;
a buried region of semiconductor material having the second conductivity type, wherein the collector region overlies the buried region and is electrically connected to the buried region;
a cathode region of semiconductor material overlying the buried region and adjacent to the base region, the cathode region having the second conductivity type, wherein the cathode region is electrically connected to the buried region; and
an anode region of semiconductor material overlying and abutting the cathode region, the anode region having the first conductivity type.
8. The semiconductor device of claim 7, further comprising:
a second base region of semiconductor material having the first conductivity type; and a second emitter region of semiconductor material having the second conductivity type, wherein the anode region is electrically connected to the second base region and the second emitter region.

9. The semiconductor device of claim 8, further comprising:
a second collector region of semiconductor material having the second conductivity type, wherein at least a portion of the second base region resides between the second emitter region and the second collector region;
a third base region of semiconductor material having the first conductivity type;
a third emitter region of semiconductor material having the second conductivity type; and
a third collector region of semiconductor material having the second conductivity type, wherein:
at least a portion of the third base region resides between the third emitter region and the third collector region; and
the third collector region is electrically connected to the second collector region.

10. The semiconductor device of claim 9, further comprising:
a higher voltage terminal; and
a lower voltage terminal, wherein:
the base region and the emitter region are electrically connected to the lower voltage terminal; and
the third base region and the third emitter region are electrically connected to the higher voltage terminal.

11. The semiconductor device of claim 10, further comprising a substrate shunt region adjacent to the third collector region, the substrate shunt region having the first conductivity type, wherein the substrate shunt region is electrically connected to the lower voltage terminal.

12. The semiconductor device of claim 7, wherein:
the cathode region and the buried region are abutting; and
the collector region and the buried region are abutting.

13. A method of fabricating an electronic device, the method comprising:
forming a first protection circuitry arrangement on a substrate, wherein forming the first protection circuitry arrangement comprises:
forming a second transistor element in the substrate, the second transistor element including a second base region and a second emitter region electrically connected to the second base region; and
forming a third transistor element in the substrate, the third transistor element including a third base region and a third emitter region electrically connected to the third base region, wherein a third collector region of the third transistor element is electrically connected to a second collector region of the second transistor element;
forming a second protection circuitry arrangement on the substrate, the second protection circuitry arrangement comprising a first transistor element and a diode element formed on the substrate, the diode element including an anode and a cathode, wherein cathode of the diode element is connected to a collector of the first transistor element and the diode element and the first transistor element are configured electrically in series;
providing a first electrical connection between a first device terminal, the second base region, and the second emitter region;
providing a second electrical connection between the second protection circuitry arrangement and a second device terminal; and
providing a third electrical connection between the third emitter region of the third transistor element and the anode of the diode element, wherein the third electrical connection results in the first protection circuitry arrangement and the second protection circuitry arrangement being configured electrically in series between the first device terminal and the second device terminal and the diode element is configured electrically in series between the first protection circuitry arrangement and the first transistor element.

14. The method of claim 13, wherein forming the second protection circuitry arrangement comprises:
forming a base region of the first transistor element in the substrate, the base region having a first conductivity type;
forming an emitter region of the first transistor element within the base region, the emitter region having a second conductivity type opposite the first conductivity type;
forming a collector region of the first transistor element in the substrate, the collector region having the second conductivity type, wherein at least a portion of the base region resides between the emitter region and the collector region;
forming a cathode region of the diode element in the substrate adjacent to the base region, the cathode region having the second conductivity type; and
forming an anode region of the diode element in the substrate abutting the cathode region, the anode region having the first conductivity type.

15. The method of claim 14, wherein forming the anode region comprises forming the anode region overlying the cathode region.

16. The method of claim 14, wherein forming the base region comprises forming the base region adjacent to the collector region.

17. The method of claim 14, wherein forming the second protection circuitry arrangement further comprises forming a buried region of semiconductor material having the second conductivity type, wherein:
the collector region overlies the buried region and is electrically connected to the buried region;
the cathode region overlies and abuts the buried region; and
the anode region overlies the cathode region.

* * * * *